(12) United States Patent
Singh (10) Patent No.: US 7,683,715 B2
(45) Date of Patent: Mar. 23, 2010

(54) FEEDBACK BIASING TECHNIQUE FOR A STAGE OF AN AMPLIFIER THAT USES A FEEDBACK CONTROL LOOP HAVING LOW GAIN

(75) Inventor: Ravpreet Singh, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 81 days.

(21) Appl. No.: 12/147,479

(22) Filed: Jun. 27, 2008

(65) Prior Publication Data

US 2009/0322420 A1    Dec. 31, 2009

(51) Int. Cl.
*H03F 3/45* (2006.01)
(52) U.S. Cl. ........................ 330/255; 330/104
(58) Field of Classification Search ................ 330/104, 330/255, 77, 81–82, 262
See application file for complete search history.

(56) References Cited

U.S. PATENT DOCUMENTS

2007/0075775 A1* 4/2007 Xi .............................. 330/255

* cited by examiner

*Primary Examiner*—Robert Pascal
*Assistant Examiner*—Hieu P Nguyen
(74) *Attorney, Agent, or Firm*—John J. Patti; Wade J. Brady, III; Frederick J. Telecky, Jr.

(57) ABSTRACT

According to an aspect of the present invention, a stage of an amplifier contains a positive feedback loop in addition to a negative feedback loop to maintain the bias currents at a desired level in the active components providing the output of the amplifier. The positive feedback loop senses the finite gain (i.e., less than the ideal infinite gain) of the negative feedback loop and compensates for the finite gain. Due to the use of the positive feedback, the duration and extent of deviation of the bias currents from the desired level is reduced, thereby minimizing the distortions in the output of the amplifier. In an embodiment, the stage corresponds to a class AB stage.

9 Claims, 4 Drawing Sheets

FEEDBACK BIASING TECHNIQUE FOR A STAGE OF AN AMPLIFIER THAT USES A FEEDBACK CONTROL LOOP HAVING LOW GAIN

BACKGROUND

1. Field of the Invention

The present invention relates generally to amplifiers, and more specifically to a feedback biasing technique for a stage of an amplifier with a feedback control loop having low gain.

2. Related Art

Amplifiers are often employed to amplify (enhance the signal level/strength of) signals. In general, an amplifier amplifies an input signal to generate an amplified output signal. For example, amplifiers are employed in, but not limited to, radio receivers and transmitters, Analog to Digital Converters (ADCs), etc.

An amplifier may contain multiple stages, with each stage performing a corresponding desired operation, as is well known in the relevant arts. For example, an earlier stage (in the signal path) may be optimized to provide voltage/current amplification, while a subsequent stage (for example, a class AB stage) may be optimized to provide amplification (e.g., power amplification) while maintaining a high efficiency.

A stage of an amplifier generally contains active components that are biased to suitable operating points. In general, an active component is designed to add signal power to an input signal and provide a corresponding output upon appropriate biasing. Such biasing generally entails providing suitable voltage/current at corresponding terminals (e.g., gate/control terminal in case of components such as transistors etc.) to enable a desired amplification, as is well known in the relevant arts.

Feedback biasing is often used associated with such active components of a stage. Feedback biasing is a biasing technique in which a bias voltage/current (or a voltage/current proportional to the bias voltage/current) provided to one or more components is sensed, and adjusted to ideally maintain the bias voltage/current at a desired level.

The sensing and adjustment may be performed using feedback techniques by a feedback control loop, with the loop designed to have a corresponding gain. For example, transistors in a class AB stage of an amplifier may be biased by a feedback control loop with a desired gain to maintain the bias voltages/currents for the corresponding components of the stage, as is also well known in the relevant arts.

The gain of the feedback control loop (products of all the input-to-output gains of individual components in the loop) may depend on several factors, including the type of component(s) used in the loop. The presence of certain types of components in the loop may cause the loop gain to be low (lower than otherwise/ideally desired). Consequently, the bias voltages/currents may not be maintained at desired levels, often causing distortions in the output signal of the amplifier.

Several aspects of the present invention enable providing a feedback biasing technique for a stage of an amplifier that uses a feedback control loop having low gain, which addresses at least the distortion aspect noted above.

SUMMARY

According to an aspect of the present invention, a stage of an amplifier contains a positive feedback loop in addition to a negative feedback loop to maintain the bias currents at a desired level in the active components providing the output of the amplifier. The positive feedback loop senses the finite gain (i.e., less than the ideal infinite gain) of the negative feedback loop and compensates for the finite gain.

Due to the use of the positive feedback, the duration and extent of deviation of the bias currents from the desired level is reduced, thereby minimizing the distortions in the output of the amplifier. In an embodiment, the stage corresponds to a class AB stage.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the features of the invention.

BRIEF DESCRIPTION OF THE DRAWINGS

The present invention will be described with reference to the following accompanying drawings, which are described briefly below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION OF EXAMPLE EMBODIMENTS

1. Example Amplifier

Figure 1:
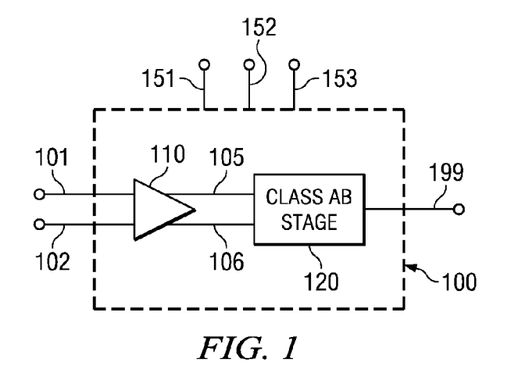
FIG. 1 is a block diagram illustrating the details of an example amplifier in which several aspects of the present invention can be implemented.

FIG. 1 shows an example amplifier implementing several aspects of the present invention. Amplifier 100 may have a voltage gain stage 110, and class AB stage 120 which may correspond to a final (output/power amplification) stage of amplifier 100. Other implementations with fewer or more number or types of components and/or stages may also be used. For example, class AB stage 120 (as well as stage 110) may be an intermediate stage, with more stages earlier or later in the signal path. Similarly, stage 110 may provide current amplification instead of voltage amplification, or be implemented as a transresistance or transconductance amplifier. Further, the stages may be configured to process single-ended as well as differential input signals, and provide single-ended or differential outputs.

Amplifier 100 receives a positive power supply on path/node 151, a negative power supply on path 152, and a ground connection via path 153. Although not shown in FIG. 1, each of stages 110 and 120 may be provided connections to all of nodes 151, 152 and 153.

Voltage gain stage 110 receives an input signal in differential form across terminals 101/102, and amplifies the voltage of input signal 101/102. Voltage gain stage 110 provides an amplified voltage output across paths 105/106 in differential form. Compared to the class AB stage 120 described below in further detail, voltage gain stage 110 is generally implemented with amplification as the primary concern, while efficiency being less of a concern, as is well known in the relevant arts.

Class AB stage 120 receives a voltage-gained (amplified) differential signal on paths 105/106, and provides further amplification. As is well known in the relevant arts, class AB stage 120 may be designed for optimum (high efficiency as measured by the ratio of output power to power consumed in the stage being as close to 1 as possible, though practically it is generally less than 0.785, as well as low distortion of output signal 199) amplification of the input received on paths 105/106, and provides a corresponding (further amplified) output on path 199. Although shown as receiving a voltage-gained signal, class AB stage 120 may, in other environments, also receive input signal 101/102 directly as inputs.

Biasing of the components of class AB stage 120 may be implemented using feedback biasing techniques. As noted above, a feedback control loop may provide such biasing to maintain the bias voltages/currents for the corresponding components of the stage at desired levels.

The features of the present invention can be appreciated in comparison to a prior class AB stage feedback biasing circuit not using one or more aspects of the present invention, and accordingly the description is continued with respect to such a prior biasing circuit.

2. Prior Class AB Stage Feedback Biasing

Figure 2:
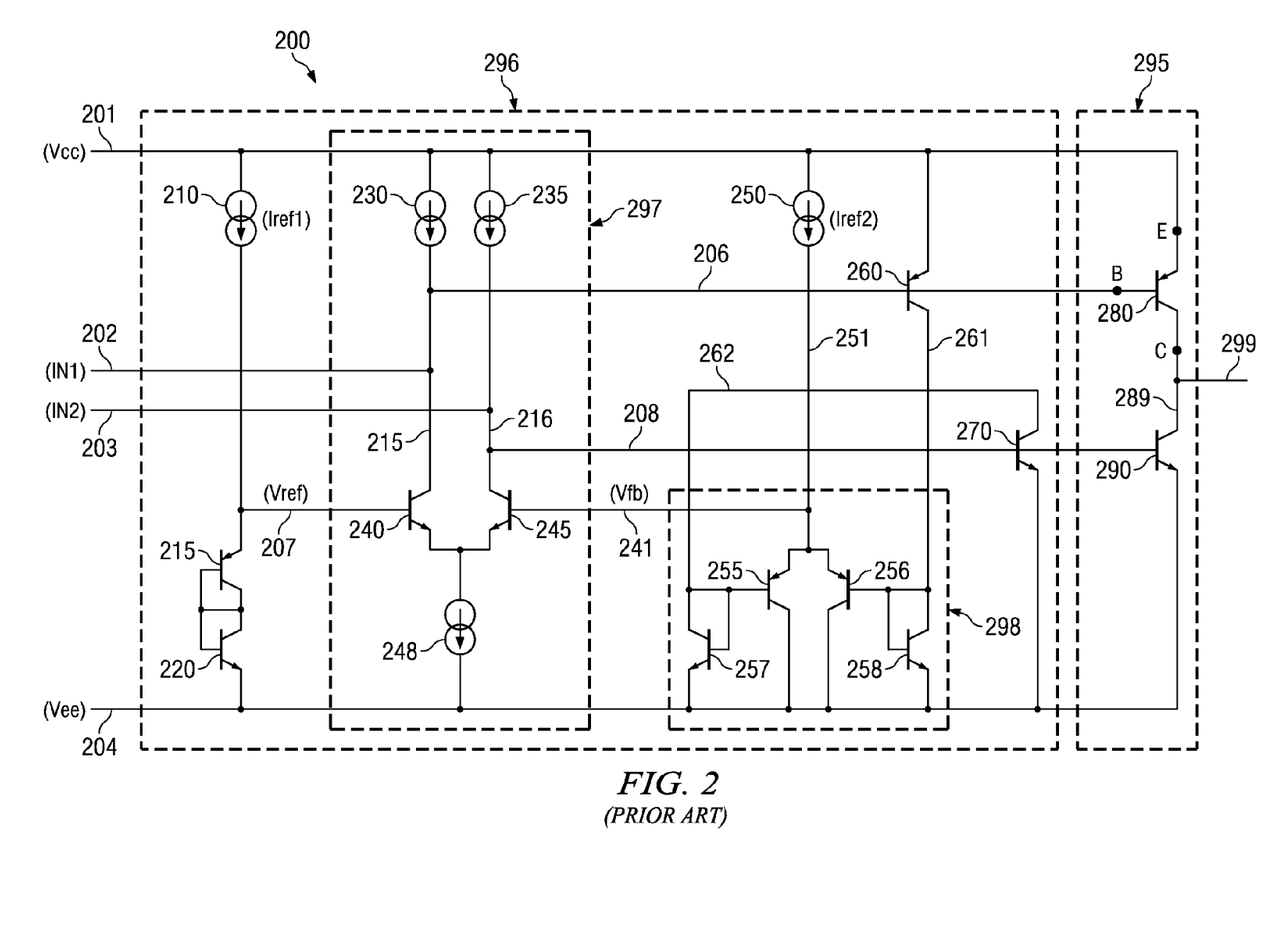
FIG. 2 is a circuit diagram of a prior class AB stage.

FIG. 2 is a circuit diagram illustrating the details of a class AB stage and the feedback control loop used to bias the components of the stage according to a prior approach. Class AB stage 200 is shown containing output portion 295 and feedback biasing portion 296. The emitter, base and collector terminals of transistor 280 are marked in FIG. 2 as E, B and C respectively. Although not marked as such in FIG. 2, corresponding terminals of other transistors in FIG. 2 have similar meanings. Class AB stage 200 receives a differential input signal across paths 202 (IN1) and 203 (IN2). Paths 202/203 may correspond to paths 105/106 of FIG. 1.

Output portion 295 receives input 202/203 via paths 206 and 208, and provides a corresponding amplified output (class AB amplification) on output path 299. The bias voltages (biasing signals) to set the desired operating points (corresponding to desired bias currents) for bipolar Junction transistors (BJTs) 280 and 290 (for example, to obtain output 299 with minimal or no distortion, etc.) are also received (provided by feedback biasing portion 296) respectively via paths (biasing paths) 206 and 208.

Output portion 295 is shown containing PNP BJT 280 and NPN BJT 290, with transistors 280 and 290 being connected in a push-pull arrangement, well known in the relevant arts. The emitter terminals of BJT 280 and BJT 290 are respectively connected to power supply terminals 201 (Vcc) and 204 (Vee) respectively. Vcc and Vee may respectively be positive and negative power supply voltages with respect to a ground terminal, not shown.

Feedback biasing portion 296 operates to provide (via paths 206 and 208) bias voltages to enable proper operation of respective BJTs 280 and 290. As is well known in the relevant arts, a bias voltage applied, for example, to the base terminal of BJT 280 (or 290) causes a desired collector current to flow out of the collector terminal of BJT 280 (or 290). In general, the bias voltage provided on paths 206 and 208 needs to ensure that at least a minimum magnitude (referred to as Imin or minimum quiescent current below) of bias current flows through (into or out of) each of the collector terminals of respective BJTs 280 and 290.

Feedback biasing portion 296 is shown containing constant current sources 210, 230, 235, 248 and 250, BJTs 215, 220, 240, 245, 255-258, 260 and 270. Current sources 230, 235, 248 and BJTs 240 and 245 constitute a differential amplifier block, denoted as 297 in FIG. 2. Portion marked as 298, containing transistors 255-258 may be viewed as a "minimum selector", and operates to provide a voltage corresponding to the minimum of the two currents on paths 261 and 262. The connection (path 262) from collector of BJT 270 to collector of BJT 257 is shown as a direct connection to simplify the description below, and the actual connection may be provided through a current mirror configuration. The operation of class AB stage 200 is described briefly below, illustrating the manner in which feedback biasing is provided.

Magnitude of current through current sources 210 and 250 is selected to be equal to Imin, the minimum bias current required to flow through either of BJTs 280 and 290 when in the "close-to-cutoff" state, i.e., when the corresponding signal IN1 or IN2 brings either of BJTs 280 and 290 close to cut-off. Assuming signals on paths 202 (IN1) and 203 (IN2) are zero volts (with respect to a common ground terminal), a total bias current equal to 2Imin would flow through path 289 (path connecting collector terminals of BJTs 280 and 290).

BJTs 260 and 270 are respectively connected to BJTs 280 and 290 in a current mirror configuration, and respectively "mirror" (generate current in proportion to) the currents flowing through the collector terminals of BJTs 280 and 290 respectively. Assuming the sizes (area) of BJTs 280 and 260, as well as of BJTs 290 and 270 are the same, currents on paths 261 and 262 respectively equal the collector currents of BJTs 280 and 290. BJTs 215 and 220 in conjunction with current source 210 operate to generate a reference voltage (Vref) on path 207.

Minimum selector block 298 provides a feedback voltage (Vfb) on path 241 corresponding to the minimum of the two currents on paths 261 and 262. It is noted that when signals IN1 and/or IN2 have non-zero magnitudes, the output collector currents of BJTs 280 and 290 (and hence on paths 261 and 262) may be different, because of the additional current caused to flow by the amplification of the signals IN1/IN2. Thus, minimum selector block 298 provides a voltage Vfb (241) corresponding to the minimum of the two currents noted above, and hence Vfb (241) corresponds to the minimum desired bias (or quiescent) current flowing through BJTs 280 and 290.

Differential amplifier block 297 amplifies the difference of voltages Vfb (241) and a reference voltage (Vref on path 207). The magnitude of Vref (207) may be set corresponding to a desired magnitude of the desired minimum bias current Imin. When bias current through the components (BJTs 280 and 290) of output stage 295 deviates from the desired value of Imin (for example due to signals IN1/IN2), Vfb (241) is different from Vref (207), and differential amplifier block 297 operates to increase or decrease the corresponding bias voltages 206 and 208 (by forcing Vfb to substantially equal Vref), thereby operating to maintain the desired minimum level of bias current Imin through the corresponding "close-to-cutoff" BJT (280 or 290).

It is noted that negative feedback is employed in the feedback control loop used to provide bias currents for the active components of the output portion 295. Assuming differential amplifier has a very high (theoretically infinite) gain, such minimum value of Imin may be maintained by the feedback control loop described above (paths 261/262-241-206/208), i.e., higher gain values of the negative feedback loop ensure that deviations of the bias current from a desired level are corrected in proportionately smaller durations.

However, the loading effect caused by BJTs 260, 270, 280 and 290 (due to the relatively low base-emitter impedance of a BJT) may cause the loop gain of the feedback control loop (noted above) to be lower than desired (finite). Correspondingly, a difference between Vref and Vfb may be viewed as being indicative of a finite gain of the negative feedback loop. However, alternative approaches can be employed to sense the finite gain as will be apparent to one skilled in the relevant arts.

It is noted that gain of differential amplifier portion 297 may be the biggest component contributing to the (total/overall) gain of the negative feedback loop). As a result, the bias current through path 289 may be less than the desired (2*Imin) when inputs IN1 and IN2 are both zero volts, and the minimum desired value of bias current through a "close-to-cutoff" one of BJTs 280/290 may fall below (less than) Imin (when input IN1 and/or IN2 is non-zero).

As a consequence of the effects noted above, output 299 may exhibit distortions, with the total harmonic distortion (THD) of output 299 exceeding an unacceptable threshold level. Further, a low loop gain (as noted above) may also cause the bias current to have significant dependence (variations) with respect to power supplies Vcc (201) and Vee (204).

A possible solution to the problems noted above may be to increase the loop gain of the feedback control loop or have multiple levels of amplification, similar to that provided by differential amplifier block 297. However, such approaches may cause the feedback loop more susceptible to instability (due to the large gain), and/or render the design/implementation more complex.

Another approach may be to decrease the loading (i.e., increase input impedance due to BJTs 260-290) of the feedback loop by inserting a common collector (e.g., Darlington connection, well known in the relevant arts) between the base terminals of each of BJTs 260/280 and input IN1, as well as between the base terminals of each of BJTs 270/290 and input IN2. However, such an approach may affect stability of a feedback control loop (not shown in the Figures) controlling the main signal path (which includes input IN1/IN2 and output 299 of FIG. 2).

Several features of the present invention overcome one or more of the problems noted above, and are described next in the context of example embodiments.

3. Compensation Circuit Forming a Positive Feedback Loop in Parallel

Figure 3:
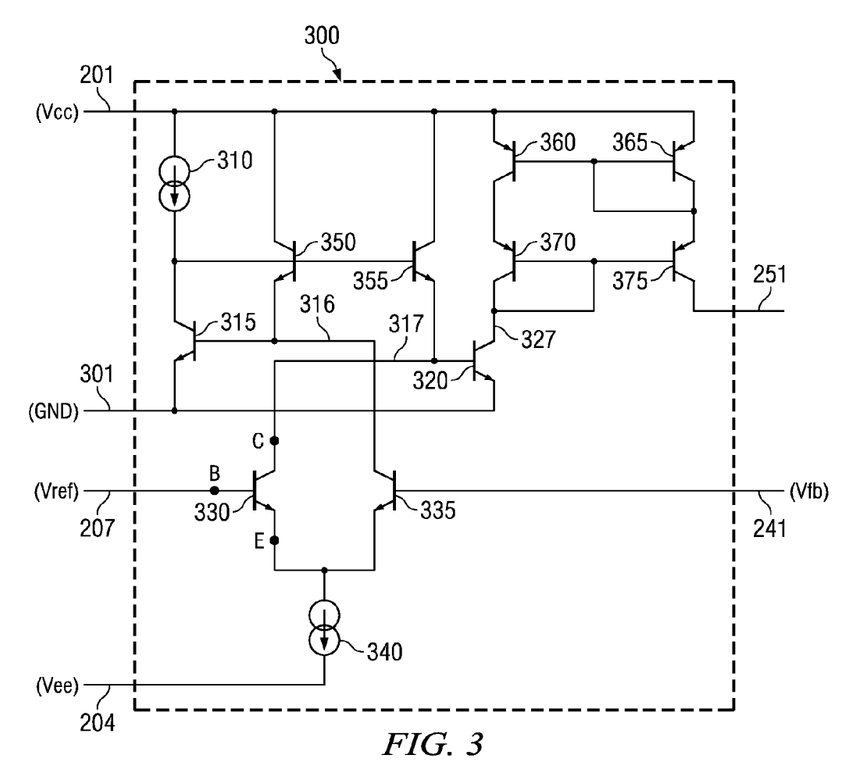
FIG. 3 is a circuit diagram of a compensation circuit (positive feedback loop) operating to compensate for the finite gain of a negative feedback loop in a stage of an amplifier, in an embodiment of the present invention.

FIG. 3 is a circuit diagram of a compensation circuit operating to compensate for lower-than-desired gain in a feedback control loop of a stage of an amplifier, in an embodiment of the present invention. Compensation circuit 300 is employed in addition, and connected in parallel to a negative feedback control loop of an amplifier stage (as shown by the common signals Vref 207, Vfb 241, and path 251). In particular, it is assumed in the following description that compensation circuit 300 is connected in parallel to feedback biasing portion 296 of FIG. 2, and the following description is made with combined reference to FIGS. 2 and 3.

Compensation circuit 300 is shown containing current sources 310 and 340, and BJTs 315, 320, 330, 335, 350, 355, 360, 365, 370 and 375. The emitter, base and collector terminals of transistor 330 are marked in FIG. 3 as E, B and C respectively. Although not marked as such in FIG. 3, corresponding terminals of other transistors in FIG. 3 have similar meanings. The connections and operation of compensation circuit 300 is described in detail below.

Current source 310 is shown connected between Vcc (201) and collector terminal of BJT 315, and is designed to provide a current of magnitude Imin (the minimum bias current required to flow through either of BJTs 280 and 290, of output stage 295 of FIG. 2, when in the "close-to-cutoff" state, i.e., when the corresponding signal IN1 or IN2 brings either of BJTs 280 and 290 close to cut-off).

Current source 310 provides base current to BJTs 350 and 355. BJT 315 is shown connected between current source 310 and ground terminal 301. Similarly, BJT 320 is shown connected between node 327 and ground terminal 301. It is noted that the base terminals of BJTs 315 and 320 may instead be connected to Vee (204) via diodes, without altering the operation of the circuit of FIG. 3.

Base terminal of BJT 330 is shown as receiving reference voltage (Vref) provided on path 207 (generated by corresponding circuitry of FIG. 2), and base terminal of BJT 335 is shown as receiving feedback voltage (Vfb 241) proportional to bias current in the output portion 295 (as described above with respect to FIG. 2) of a class AB stage. The emitter terminals of each of BJTs 330 and 335 are connected to current source (or current sink) 340.

The collector terminal of BJT 330 is connected to the emitter terminal of BJT 355 via path 317, while the collector terminal of BJT 335 is connected to the emitter terminal of BJT 350 via path 316. BJT pairs 360/365 and 370/375 are each shown connected in a current mirror configuration, and the pairs 360/265 and 370/375 may together be conveniently referred to as a 'current mirror block'. The combination of BJTs 360, 365, 370 and 375 is provided in place of current source 250 of FIG. 2. The combination may be viewed as a current mirror block having three terminals, respectively connected to Vcc 201, node 327 and path 251.

BJTs 330 and 335, in combination with current source 310, and BJTs 315, 320, 350, 355, 370 and 360 operating as the corresponding loads, form a differential amplifier structure. Collector current of BJT 335 on path 316, and collector current of BJT 330 on path 317 are thus, determined by the magnitudes of voltages Vref (207) and Vfb (241).

As described above with respect to FIG. 2, a difference between voltages Vref (207) and Vfb (241) (referred to below also as difference voltage) indicates that the bias current through the components (BJTs 280 and 290) of output stage 295 is different from the desired value (Imin in the above description).

The circuit of FIG. 3 operates to provide current 251 (and replaces current source 250 of FIG. 2), and maintain the bias current through BJTs 280 and 290 at the desired level, thereby minimizing the distortions in the output signal, as described below in further detail.

First, it may be observed that the difference voltage is also provided to compensation circuit 300. Since current on path 251 is now provided by the 'arm' (load portion) connected to the collector terminal of BJT 330 controlled by voltage Vref (207), compensation circuit 300 connected as noted above operates as a positive feedback loop, i.e., an increase in the magnitude of voltage Vfb (241) (to value greater than Vref 207) causes a proportional increase (positive correlation) in the magnitude of current 251.

To illustrate, an increase in the magnitude of Vfb (241) causes collector current of BJT 335 to increase. As a result, current passing through BJT 350 also increases. Since BJTs 330 and 335 form a common emitter differential pair, with the sum of their collector currents (on respective paths 317 and 316) being held constant, and equal to current through constant current sink 340, collector current of BJT 330 (and hence current passing through BJT 355) decreases. Thus, when collector current of 335 increases, collector current of 330 decreases, as the sum of their collector currents must remain the same. However, current passing through BJT 315 does not change in response to the change in Vfb (241), due to (constant) current source 310.

As a result of the effects noted above, the base-emitter voltage of BJT 350 (Vbe350) increases, while base-emitter voltage of BJT 355 (Vbe355) decreases. However, the relation (KVL) expressed by the following equation must hold true:

$$Vbe315+Vbe350=Vbe355+Vbe320 \qquad \text{Equation 1}$$

wherein,

Vbe315 is the base-emitter voltage of BJT 315, and

Vbe320 is the base-emitter voltage of BJT 320.

For the relation of Equation1 to be satisfied, Vbe320 must increase correspondingly. Therefore collector current of BJT 320 must increase. Thus, current passing through BJTs 360 and 370 must increases. Since, BJT 365 and 375 are connected to BJTs 360 and 370 in a current mirror configuration, the current through BJTs 365 and 375, i.e., current on path 251 must increase.

Similarly, assuming Vfb 241 were to decrease (to a value less than Vref 207), current on path 251 would decrease proportionately. The circuit of FIG. 3, thus, operates as a positive feedback loop. It may also be noted from the above description that there is a positive correlation between a change in current 251 and the difference between voltages Vfb 241 and Vref 207.

Since compensation circuit 300 is connected to receive Vref and Vfb in parallel (to feedback biasing portion 296), there is no loading in the main signal path (paths containing inputs IN1 and IN2).

When Vref (207) is different from Vfb (241), collector currents of BJT 240 and 245 (paths 215 and 216 respectively, in FIG. 2) have different magnitudes. As noted above, a difference between Vref and Vfb may be viewed as being indicative of a finite gain (rather than an ideally infinite or very high gain) of the negative feedback loop of FIG. 2, described above). The sizes (length, width, etc.) of BJTs 330 and 335 are each equal to (or each proportional to by a same ratio) the sizes of transistors 240 and 245 (FIG. 2) respectively. Magnitude of current sunk by current sinks 340 and 248 are also either equal or in proportion by the same ratio noted above.

Applying Kirchoff's voltage law (KVL) to the translinear loop formed by closed path (emitter of BJT 257-base of BJT 257-base of BJT 255-emitter of BJT 255-base of BJT 245-emitter of BJT 245-emitter of BJT 240-base of BJT 240-emitter of BJT 215-base of BJT 215-base of BJT 220-emitter of BJT 220) provides the following equation:

$$Vbe257+Vbe255-Vbe245+Vbe240-Vbe215- \\ Vbe220=0 \qquad \text{Equation 2}$$

wherein,

Vbe257, Vbe255, Vbe245, Vbe240, Vbe 215 and Vbe220 respectively equal the base-to-emitter voltages of BJTs 257, 255, 245, 240, 215 and 220.

As is well-known, the collector current Ic of a BJT may be expressed by the following equation:

$$Ic=Is*(\exp(Vbe/(n*VT))) \qquad \text{Equation 3}$$

Wherein,

'Ic' is the collector current of the BJT,

'Is' is the reverse saturation current of the BJT, 'exp' represents the exponential operation, 'n' is an integer with a value based on the type of semiconductor material used to fabricate the BJT, with n being approximately equal to 1 for silicon material, 'VT' is the voltage equivalent of temperature.

Equation 3 may be rewritten as follows:

$$Vbe=\ln Ic+\ln (VT/Is) \qquad \text{Equation 4}$$

wherein, ln represents the "natural logarithm of" operation.

It may be noted that respective collector currents of BJT 257 and BJT 270 equal current on path 289. Assuming that class AB stage 200 of FIG. 2 is in a quiescent state (inputs IN1 and IN2 equal 0 volts), and current source 210 (Iref1) of the prior circuit of FIG. 2 is designed to provide a current Imin, from the expressions in equations 2, 3 and 4 above, it may be shown that:

$$I289=(Ic240/Ic245)*(Imin/Iref2)*2*Imin \qquad \text{Equation 5}$$

Wherein,

I289 is the bias current on path 289 of FIG. 2 in the quiescent state (output quiescent current), Ic240 is the collector current (path 215) of BJT 240 in the quiescent state, Ic245 is the collector current (path 216) of BJT 245 in the quiescent state, Iref2 is the current on path 251, and '*' represents a multiply operation.

If Iref2 in equation 5 is made equal to [(Ic240/Ic245) *Imin], then it may be observed from equation 5 that output quiescent current I289 equals 2*Imin (two times Imin), as desired, and as noted above with respect to FIG. 2.

With respect to FIG. 3, from a similar analysis of the translinear loop formed by closed path (base of BJT 355-emitter of BJT 355-base of BJT 320-emitter of BJT 320-emitter of BJT 315-base of BJT 315-emitter of BJT 350-base of BJT 350), it may be shown that the magnitude of current on path 251 (FIG. 3) equals [(Ic240/Ic245)*Imin]. Thus, if IRef2 (250) of FIG. 2 were to be provided equal to [(Ic240/Ic245) *Imin] (rather than as Imin in the prior circuit of FIG. 2), output quiescent current (path 289 of FIG. 2) is maintained at a magnitude 2*Imin, and the magnitude of current through the corresponding "close-to-cutoff" BJT (280 or 290) is maintained at Imin, as desired.

From the description above, compensation circuit 300 receives the reference voltage (Vref 207) and feedback voltage (Vfb 241) used by the negative feedback loop of feedback biasing portion 296 (FIG. 2), and provides a (constant) reference current to minimum selector portion 298 equal to a product of the desired minimum bias current Imin of the output stage and the ratios of the collector currents (of the active components of a differential amplifier 297).

Thus, compensation circuit 300 may be viewed as sensing the finite gain of the negative feedback loop, and compensating for the finite gain by varying (providing additional current) current on path 251 (Iref2), thereby adjust the biasing signals (voltages) provided to the base terminals of BJTs 280/290 to quickly reduce the difference between Vref 207 and Vfb 241 to zero.

It is noted that even though compensation circuit 300 employs positive feedback, the gain of the positive feedback loop is made much lesser than the gain of the negative feedback loop of feedback biasing portion 296. Thus, overall feedback is ensured to be always negative, and hence the overall feedback loop (negative plus positive feedback loops) is ensured to be stable (no oscillations or divergence).

Thus, the use of a positive feedback loop using compensation circuit 300 in parallel to feedback biasing portion 296 ensures maintaining a desired level of bias current in the output stage, despite a lower-than-desired value of gain of the negative feedback loop (of feedback biasing portion 296) and/or variations in power supplies Vcc (201) and Vee (204).

It may also be appreciated that the techniques described above neither increase the gain of the negative feedback loop (which may lead to negative feedback loop stability issues), nor employ techniques to increase the input impedance (seen by the negative feedback loop) of the active components of the output stage (which may lead to stability of the feedback control loop employed for amplification of the signal (IN1/IN2), as noted above).

The circuit of FIG. 2 (containing a negative feedback loop, as described above, but with current source Iref2 (250) being removed, and current on path 251 (equal to [(Ic240/Ic245)*Imin]) being provided instead by the circuit of FIG. 3) in combination with the compensation circuit of FIG. 3 (operating as a positive feedback loop, as described above) is illustrated in FIG. 4, which is a circuit diagram of a class AB stage 400. Class AB stage 400 is shown containing an output portion (transistors 280 and 290) plus an improved feedback bias portion (biasing loop, containing the combination of the negative feedback loop and positive feedback loop of FIGS. 2 and 3 respectively, in an embodiment of the present invention). A description of class AB stage 400 is not provided as having been described in detail above. It is noted that the ground connection from base of BJTs 315 and 320 (FIG. 3) is replaced instead by a connection via diodes (formed by the connections of BJTs 410 and 420) to Vee (204). It is also noted that although the connection (path 262) from collector of BJT 270 to collector of BJT257 is shown as a direct connection, the actual connection may be provided through a current mirror configuration, as illustrated in FIG. 5. A schematic of the circuit realization in accordance with the descriptions of FIGS. 3 and 4 is accordingly shown in FIG. 5.

In the instant application, the power and ground terminals are referred to as reference potentials, the emitter and collector terminals of transistors (though which a current path is provided when turned on and an open path is provided when turned off) are termed as current terminals, and the base terminal is termed as a control terminal. The current sources may be replaced by current sinks in such alternative embodiments and the current sources and sinks are accordingly commonly referred to as current elements.

Furthermore, though the various terminals/nodes in the Figures are shown with direct connections to other terminals, it should be appreciated that additional components (as suited for the specific environment) may also be present in the path, and accordingly the connections may be viewed as being electrically coupled to the same connected terminals.

Figure 4:
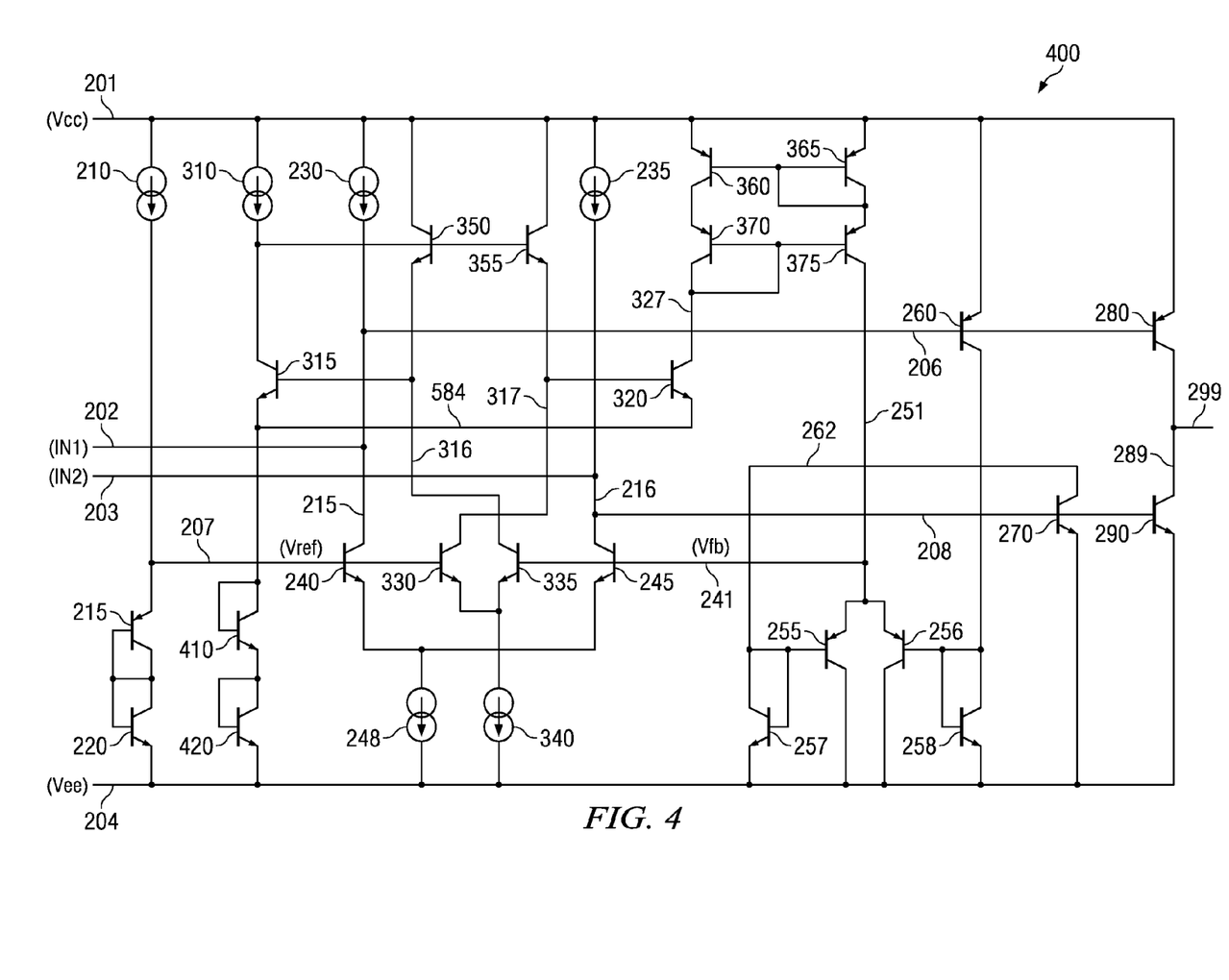
FIG. 4 is a circuit diagram of a class AB stage in an embodiment of the present invention.
Figure 5:
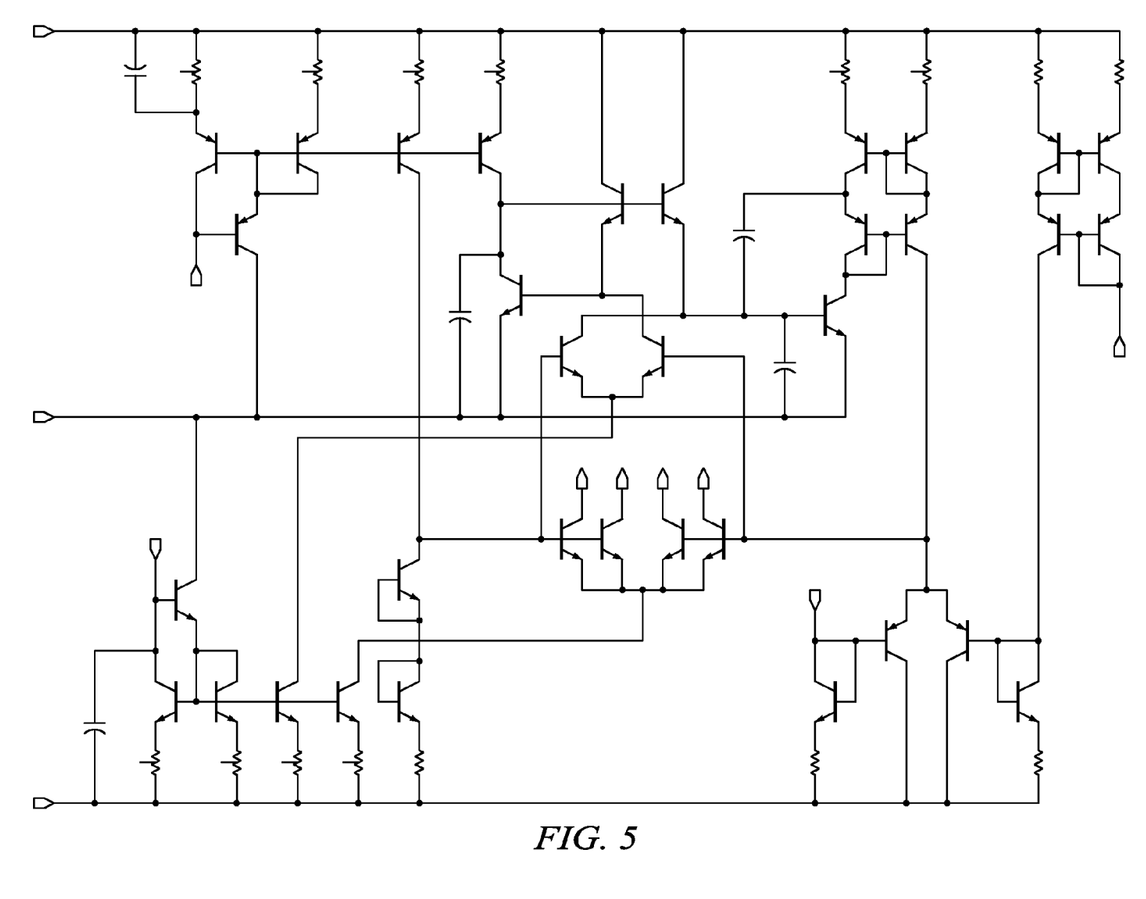
FIG. 5 is a schematic diagram of a class AB stage in an embodiment of the present invention.

In addition, the specific circuit topologies/connections of FIGS. 3, 4 and 5 are merely representative. Various modifications, as suited for the specific environment, without departing from the scope and spirit of several aspects of the present invention, will be apparent to one skilled in the relevant arts by reading the disclosure provided herein While various embodiments of the present invention have been described above, it should be understood that they have been presented by way of example only, and not limitation. Thus, the breadth and scope of the present invention should not be limited by any of the above-described embodiments, but should be defined only in accordance with the following claims and their equivalents.

What is claimed is:

1. An amplifier to amplify an input signal and generate an amplified output signal, said amplifier comprising:

an output portion containing a plurality of active components, which together generate said amplified output signal in response to receiving said input signal and a biasing signal, wherein said biasing signal causes a bias current to flow in said plurality of active components, wherein said bias current is to be at a desired level to ensure that said amplified output signal has distortion below an acceptable threshold;

a biasing loop containing a negative feedback loop and a positive feedback loop, wherein said negative feedback loop operates to sense said bias current and to control said biasing signal to correct any variations in said bias current, wherein a higher gain of said negative feedback loop ensures that any deviation of said bias current from said desired level is corrected in a proportionately smaller duration, wherein said positive feedback loop senses the finite gain of said negative feedback loop and compensates for said finite gain.

2. The amplifier of claim 1, wherein said plurality of active components comprises a first transistor and a second transistor, each having a current path between a pair of current terminals when a control terminal is asserted with a first voltage range and a open path otherwise, wherein said first transistor and said second transistor are coupled such that the current path of said first transistor is in series with the current path of said second transistor, and wherein a junction of said first transistor and said second transistor provides said amplified output signal.

3. The amplifier of claim 2, wherein said first transistor and said second transistor are coupled in a class AB configuration.

4. The amplifier of claim 2, wherein said negative feedback loop receives a reference voltage and a feedback voltage and changing said biasing signal to cause said reference voltage to equal said feedback voltage, wherein said finite gain of said negative feedback loop causes a time lag in making said reference voltage equal to said feedback voltage, said positive feedback loop also receiving said reference voltage and said feedback voltage, wherein a difference of said reference voltage and said feedback voltage is indicative of said finite gain of said negative feedback loop, said positive feedback loop introducing an additional current with a magnitude having positive correlation with said difference to adjust said biasing signal to quickly reduce said difference to zero, whereby said bias current is maintained at said desired level.

5. The amplifier of claim 4, wherein said positive feedback loop comprises:

a first current element connecting a first node to a first reference potential;

a third transistor and a fourth transistor, wherein a first current terminal of each of said third transistor and said fourth transistor is coupled to said first node, a control terminal of said third transistor to receive said reference voltage and a control terminal of said fourth transistor to receive said feedback voltage;

a fifth transistor and sixth transistor, wherein a first current terminal of each of said fifth transistor and said sixth transistor are coupled to a second reference potential, wherein a control terminal of said fifth transistor is coupled to a second current terminal of said fourth transistor, wherein a control terminal of said sixth transistor is coupled to a second current terminal of said third transistor;

a second current element connecting a second current terminal of said fifth transistor to a third reference potential;

a seventh transistor and a eighth transistor, wherein a control terminal of each of said seventh transistor and said eighth transistor is coupled to said second current terminal of said fifth transistor, wherein a first current terminal of said seventh transistor is coupled to said control terminal of said fifth transistor, wherein a first current terminal of said eighth transistor is coupled to said control terminal of said sixth transistor, wherein a second current terminal of each of said seventh transistor and said eighth transistor is coupled to said third reference potential; and a current mirror block with a first terminal coupled to a second current terminal of said sixth transistor, a second terminal coupled to said third reference potential and a third terminal providing said additional current.

6. The amplifier of claim 5, wherein said negative feedback loop comprises:

a differential amplifier to amplify said input signal, said differential amplifier also to receive said reference voltage and said feedback voltage and to provide a first biasing signal and a second biasing signal together forming said biasing signal;

a ninth transistor to mirror a first current in said first transistor to form a first mirrored current;

a tenth transistor to mirror a second current in said second transistor to form a second mirrored current;

a minimum selector block to receive said first mirrored current, said second mirrored current, said additional current, and to generate said feedback voltage;

a load and a third current element, together coupled in series between said third reference potential and said first reference potential, wherein a junction of said load and said third current element provides said reference voltage.

7. The amplifier of claim 6, wherein each of said first transistor and said second transistor is a bipolar junction transistor (BJT).

8. The amplifier of claim 3, wherein said output portion and said biasing loop constitute a class AB stage, said amplifier further comprising a second stage to also amplify said input signal.

9. An amplifier to amplify an input signal and generate an amplified output signal, said amplifier comprising:

a class AB stage comprising a first transistor and a second transistor, each having a current path between a pair of current terminals when a control terminal is asserted with a first voltage range and a open path otherwise, wherein said first transistor and said second transistor are coupled such that the current path of said first transistor is in series with the current path of said second transistor, and wherein a junction of said first transistor and said second transistors provides said amplified output, a control terminal of said first transistor receiving a first biasing signal and a control terminal of said second transistor receiving a second biasing signal;

a negative feedback loop comprising:

a differential amplifier to amplify said input signal, said differential amplifier also to receive a reference voltage and a feedback voltage and to provide said first biasing signal and said second biasing signal, wherein said feedback voltage represents a magnitude of a bias current flowing through said current path in response to said first biasing signal and said second biasing signal;

a ninth transistor to mirror a first current in said first transistor to form a first mirrored current;

a tenth transistor to mirror a second current in said second transistor to form a second mirrored current;

a minimum selector block to receive said first mirrored current, said second mirrored current, an additional current, and to generate said feedback voltage; and a load and a third current element, together coupled in series between a third reference potential and a first reference potential, wherein a junction of said load and said third current element provides said reference voltage; and a positive feedback loop comprising:

a first current element connecting a first node to said first reference potential;

a third transistor and a fourth transistor, wherein a first current terminal of each of said third transistor and said fourth transistor is coupled to said first node, a control terminal of said third transistor to receive said reference voltage and a control terminal of said fourth transistor to receive said feedback voltage;

a fifth transistor and sixth transistor, wherein a first current terminal of each of said fifth transistor and said sixth transistor are coupled to a second reference potential, wherein a control terminal of said fifth transistor is coupled to a second current terminal of said fourth transistor, wherein a control terminal of said sixth transistor is coupled to a second current terminal of said third transistor;

a second current element connecting a second current terminal of said fifth transistor to said third reference potential;

a seventh transistor and a eighth transistor, wherein a control terminal of each of said seventh transistor and said eighth transistor is coupled to said second current terminal of said fifth transistor, wherein a first current terminal of said seventh transistor is coupled to said control terminal of said fifth transistor, wherein a first current terminal of said eighth transistor is coupled to said control terminal of said sixth transistor, wherein a second current terminal of each of said seventh transistor and said eighth transistor is coupled to said third reference potential; and a current mirror with a first terminal coupled to a second current terminal of said sixth transistor, a second terminal coupled to said third reference potential and a third terminal providing said additional current.

* * * * *